United States Patent [19]

Obinata

[11] Patent Number: 5,341,003

[45] Date of Patent: Aug. 23, 1994

[54] MOS SEMICONDUCTOR DEVICE HAVING A MAIN UNIT ELEMENT AND A SENSE UNIT ELEMENT FOR MONITORING THE CURRENT IN THE MAIN UNIT ELEMENT

[75] Inventor: Shigeyuki Obinata, Kanagawa, Japan

[73] Assignee: Fuji Electric Co., Ltd., Kanagawa, Japan

[21] Appl. No.: 895,742

[22] Filed: Jun. 9, 1992

[30] Foreign Application Priority Data

Jun. 10, 1991 [JP] Japan ................... 3-136881

[51] Int. Cl.⁵ .......................... H01L 27/02
[52] U.S. Cl. ........................ 257/135; 257/337; 257/378; 257/341
[58] Field of Search ............ 257/133, 135, 337, 339, 257/341, 378

[56] References Cited

U.S. PATENT DOCUMENTS

| | | | |
|---|---|---|---|
| 4,893,158 | 1/1990 | Mihara et al. | 257/341 |
| 5,097,302 | 3/1992 | Fujihira et al. | 257/341 |
| 5,191,395 | 3/1993 | Nishimura | 257/378 |

FOREIGN PATENT DOCUMENTS

| | | | |
|---|---|---|---|
| 1-39069 | 2/1989 | Japan | 257/339 |
| 1-215067 | 8/1989 | Japan | 257/339 |
| 338516 | 10/1989 | Japan | 257/341 |

*Primary Examiner*—Rolf Hille
*Assistant Examiner*—Minhloan Tran
*Attorney, Agent, or Firm*—Finnegan, Henderson Farabow, Garrett & Dunner

[57] ABSTRACT

A MOS semiconductor device is disclosed for monitoring the value of the current flowing through an element by outputting a sense signal. The semiconductor has a main unit element and a sense unit element formed in a semiconductor layer, and the current flowing through the sense unit element is proportional to the current flowing through the main unit element. Both the main unit element and the sense unit element have a base region, a source region, a gate electrode, and a source electrode. A doped region of the same conductivity type as the base regions is formed in the semiconductor layer between the base regions of the main unit element and the sense unit element. This doped region is in contact with the source electrode of the main unit element. This structure decreases the power loss due to the sense signal current and ensures a linear relationship between the sense signal current and the main current.

16 Claims, 3 Drawing Sheets

MOS SEMICONDUCTOR DEVICE HAVING A
MAIN UNIT ELEMENT AND A SENSE UNIT
ELEMENT FOR MONITORING THE CURRENT IN
THE MAIN UNIT ELEMENT

BACKGROUND OF THE INVENTION

1. Field of the Invention

The present invention relates to a MOS semiconductor device, such as a vertical MOSFET, an insulated gate bipolar transistor (abbreviated as IGBT), or a smart power device, having a main unit element and a sense unit element for monitoring the current in the main unit element.

2. Discussion of the Related Art

When power MOSFETs or IGBTs are incorporated into a power converting device, it may be necessary to monitor the value of the current flowing through the semiconductor element by outputting a sense signal to the exterior of the device in order to protect the semiconductor device and elements from being damaged. FIG. 2 is an equivalent circuit of an IGBT which has the ability to sense an overcurrent flowing through the source-drain path of the IGBT. As shown in FIG. 2, a single semiconductor element 20 contains a plurality of IGBTs, a main cell IGBT element 21 and a sense cell IGBT element 22. Elements 21 and 22 have a common drain terminal D and a common gate terminal G. Main unit element 21 and sense unit element 22 have source terminals S and S', respectively. A sense resistor R is inserted between source terminals S and S'. Load 23 and power source 24 are connected to common drain terminal D. With this arrangement, when a voltage is applied to common gate terminal G, on-currents I and I' flow through main unit element 21 and the sense unit element 22, respectively. On current I is proportional to on-current I' and can be determined from the voltage representative of the product of the resistor R and the on-current I'.

FIG. 3 is a cross sectional view showing cell structures of a main unit element 21 and a sense unit element 22 of an IGBT. In main unit element 21, a p⁻ base layer 4 (first region) and an n+ source layer 5 (second region) are formed in a surface region of base layer 4. A p+ well 6, partially overlapping source layer 5, is also formed in the surface region of the first major surface of an n⁻ layer 1. The second major surface of n⁻ layer 1 is formed on n⁻ buffer layer 2. N+ buffer layer 2 is formed on p+ drain layer 3 (fifth region). The sense unit element includes a p⁻ base layer 41, an n+ source layer 51 formed in base layer 41, and a p+ well 61 partially overlapping source layer 51. The region of the base layer 4 located between source layer 5 and n⁻ layer 1 serves as a channel forming region 7. Similarly, a portion of base layer 41, located between source layer 51 and n⁻ layer 1, serves as channel forming region 71.

Gate oxide films 8 are formed on the first major surface of the n⁻ layer 1, and gate electrodes 9 are further formed on the gate oxide films 8. A conductive layer is insulated from gate electrodes 9 by insulation film 10 and divided into source electrodes 11 and 12 connected to source terminals S and S', respectively. Source electrode S' picks up the sense signal. Source electrode 12, having a reduced area, contacts both p+ well 61 and n+ source layer 51 through openings in insulation film 10. Source electrode 11 contacts both p+ well 6 and n+ source layer 5. P+ drain layer 3 contacts drain electrode 13, which is connected to the common drain terminal D.

In operation, when a positive potential is applied to common gate terminal G of the IGBT, electrons are generated in channel forming regions 7 and 71 beneath both oxide films 8, thus forming channel inversion layers. N+ source layers 5 and 51 are electrically connected to n⁻ layer 1 via the channel inversion layers, so that electrons flow from the n+ source layers through the channel inversion layers, the n⁻ layer 1, and the n+ buffer layer 2 into the p+ drain layer 3. In conjunction with the flow of electrons, holes are injected from p+ drain layer 3 into n⁻ layer 1 through n+ buffer layer 2, so that conductivity modulation occurs in the n⁻ layer 1 so that the resistance in this region is reduced. The low on-resistance facilitates current flow between drain electrode 13 and source electrode 11, and between the drain electrode and sense-signal-pickup source electrode 12. These currents are proportional to the number of cell structures which are formed in the regions of the main unit element and the sense unit element, respectively.

The semiconductor device described above has the following problem. In order to output a sense signal from the IGBT, a metal wire is bonded to the surface of the source electrode 12 by an appropriate bonding technique. Wire bonding, however, requires relatively wide area of 0.5 to 1 mm². Since the cell coming in contact with source electrode 11 of the main unit element cannot be formed under the source electrode 12, in the conventional structure, the amount of current flowing into sense-signal pickup source electrode 12 is increased and the current flowing into source electrode 11 of the main unit element 21 is correspondingly decreased. As a result, the power loss through resistor R in device is increased.

The semiconductor device described above has another problem. When the semiconductor device is in the on-state, depletion layers are formed which extend from the junctions of p⁻ base layers 4 and 41 and the n⁻ layer 1 into a portion of n⁻ layer 1 between p⁻ base layers 4 and 41 and the p+ wells 6 and 61. These depletion layers extend into regions beneath source electrode 12 which do not contain any cell structure. When the semiconductor device is turned on and off, the voltage applied between source electrodes 11 and 12 and drain electrode 13 varies, causing these depletion layers to repeatedly appear and disappear. The current that flows into source electrode 12 due to the compensating charge or discharged charge (i.e., stored charge at these switched p-n junctions) resulting from the repetitive appearance and disappearance of the depletion layer is not proportional to the current that flows into the source electrode 11. As a result, as shown in FIG. 4, a transient response region 40 (dotted line) occurs in which the relationship between the sense signal current I' and the main current I, when the semiconductor device in an on state, is nonlinear. When this occurs, the sense current signal I' cannot be used to accurately monitor the main current I.

SUMMARY OF THE INVENTION

The present invention has been made in view of the above circumstances and has as an object to provide a MOS semiconductor device which has less power loss due to the sense signal current, and can secure a linear relationship between the sense signal current and the main current.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the MOS semiconductor device of this invention comprises a plurality of first regions of a second conductivity type selectively formed in the surface region of a semiconductor layer of a first conductivity type, a second region of the first conductivity type selectively formed in the surface region of each first region, the region of each first region which is located between the semiconductor layer and the second region serving as a channel forming region, a gate electrode formed on a gate insulating film formed on each channel forming region, a source electrode contacting with both each first region and the second region, each source electrode divided into a main electrode and a sense-signal-pickup source electrode, the sense-signal-pickup electrode being connected through a resistor to the main electrode, and a third region of the second conductivity type formed in the surface region located between the first region contacting with the main source electrode and the first region contacting with the sense-signal-pickup source electrode, the third region being located apart from the first region, and the main source electrode also contacting with the third region. When the MOS semiconductor device is a vertical MOSFET, a fourth region of the first conductivity type having a high impurity concentration may be provided adjacent to the major surface of the semiconductor layer which is opposite to the major surface having the first regions. When it is an IGBT, a fifth region of the second conductivity type having a high impurity concentration may be provided adjacent to the major surface of the semiconductor layer which is opposite to the major surface thereof having the first regions.

The third region and each first region are placed at the same potential by the main source electrode. When a depletion layer expands from the junction between each first region and the semiconductor layer, another depletion layer similarly expands from the junction of the third region and the semiconductor layer. The charge and discharge currents, caused when the depletion layer appears and disappears when the semiconductor device is turned on and off, also flow from the third region to the main source electrode. Accordingly, the charge and discharge currents flowing into the sense-signal-pickup source electrode is derived from only the region corresponding to each first region in the cell structure of the sense unit element, and therefore it is greatly reduced relative to that of the conventional semiconductor device. As a result, there is no abnormal increase of the sense signal current in the transient period, and the sense signal current linearly increases with respect to the main current, as indicated by a solid line in FIG. 4. The stationary on-current flows through the third region between the drain electrode and the main source electrode, which is formed on the other major surface of the semiconductor layer. Accordingly, the on-current flowing into the sense unit element source electrode is reduced, so that the power loss of the semiconductor device is also reduced.

In another embodiment, the MOS semiconductor device of this invention comprises a semiconductor layer, a main unit element formed in the semiconductor layer including a base layer, a source layer, a gate electrode, and a main source electrode contacting the base layer and the source layer, a sense unit element formed in said semiconductor layer including a base layer, a source layer, a gate electrode, and a sense signal pickup source electrode contacting the base layer and the source layer, and a doped region formed in a surface of the semiconductor layer between the base layer of the main unit element and the base layer of the sense unit element, the doped region being formed apart from the base layers and being in contact with the main source electrode.

BRIEF DESCRIPTION OF THE DRAWINGS

The accompanying drawings, which are incorporated in and constitute a part of this specification illustrate embodiment(s) of the invention and, together with the description, serve to explain the objects, advantages and principles of the invention. In the drawings.

DETAILED DESCRIPTION OF THE PREFERRED EMBODIMENTS

Figure 1:
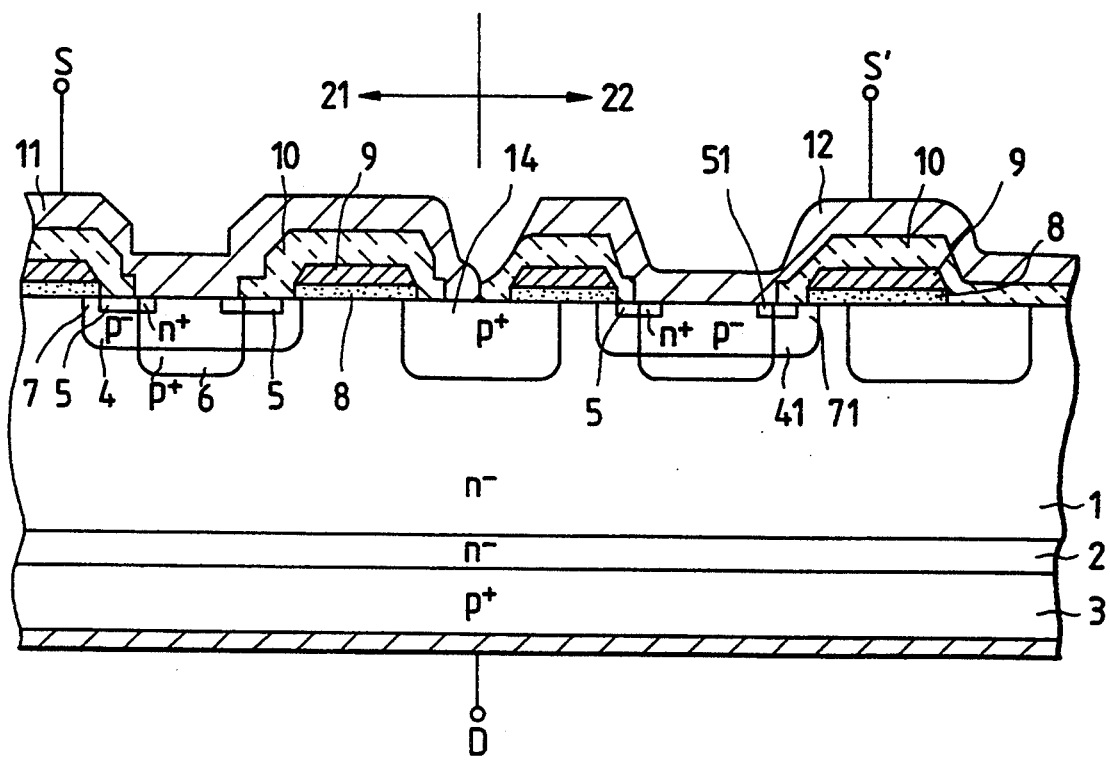
FIG. 1 is a cross sectional view showing a part of an IGBT according to an embodiment of the present invention.
Figure 2:
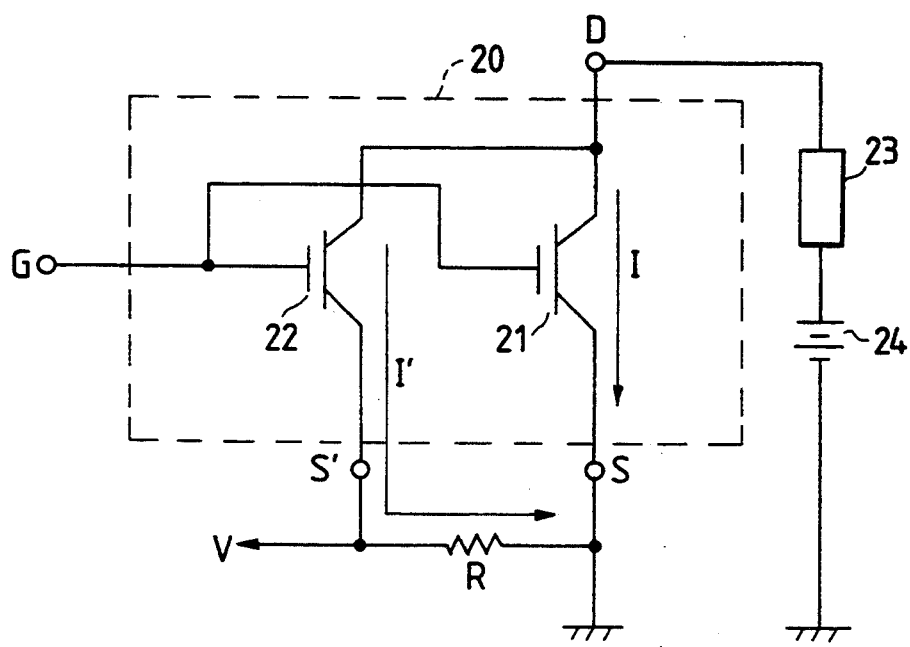
FIG. 2 is an equivalent circuit of an IGBT according to the present invention.
Figure 3:
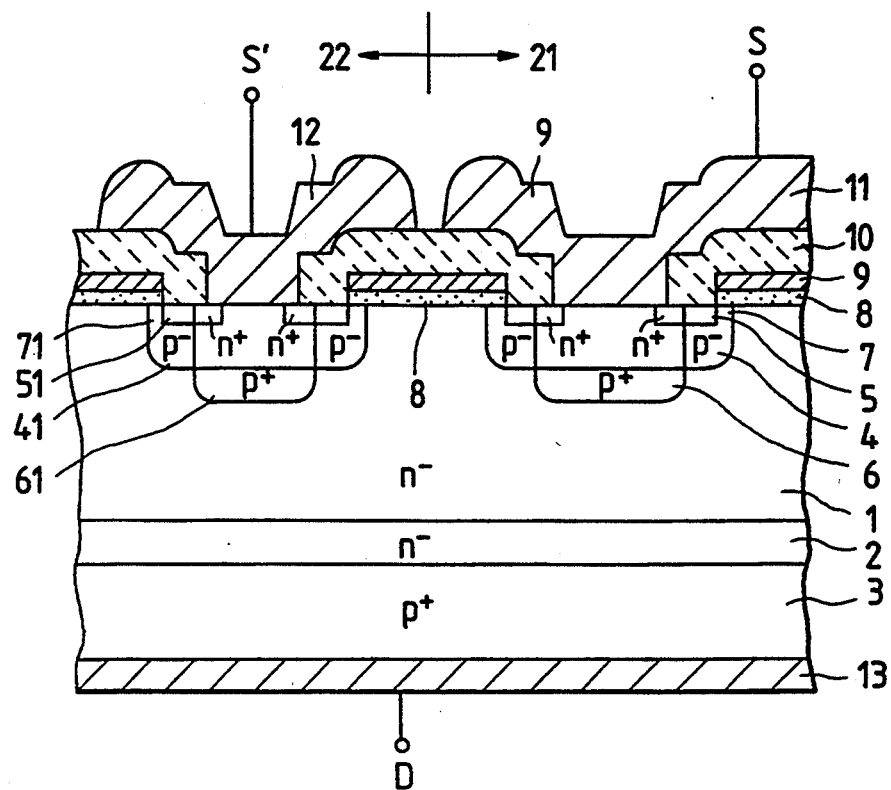
FIG. 3 is a cross sectional view showing a part of a conventional IGBT.
Figure 4:
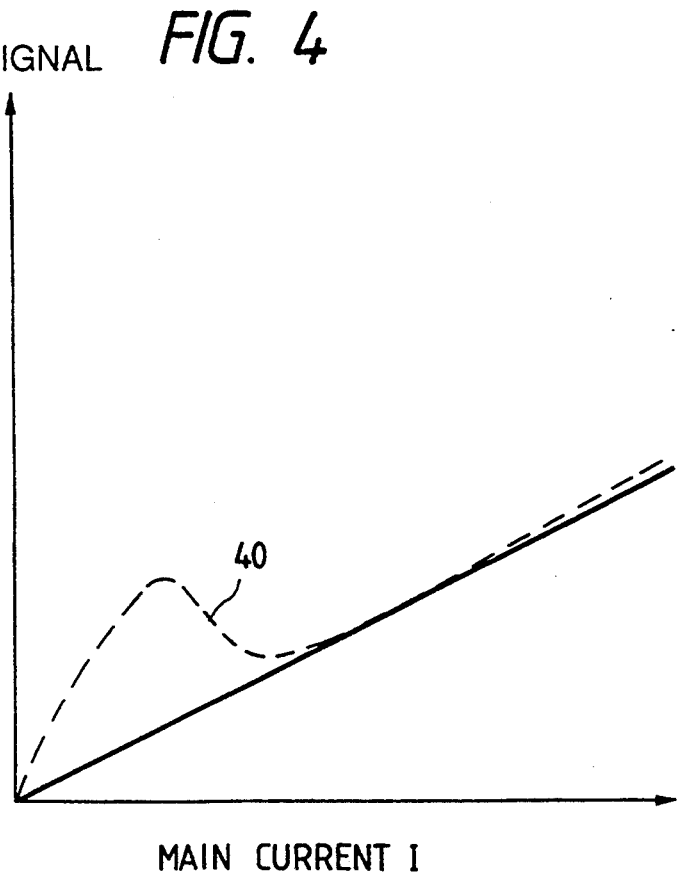
FIG. 4 is a graph comparatively showing sense signal current vs. main current relationships of a conventional semiconductor device and the semiconductor device of the invention.

FIG. 1 is a cross sectional view showing cell structures of an IGBT according to an embodiment of the present invention. In FIG. 1, the cell structures resemble those shown in FIG. 3, and like reference numerals are used for designating like portions in FIG. 1 and FIG. 3. The structure of FIG. 1 is different from that of FIG. 3 in that p+ region 14 (third region) is formed, simultaneously with p+ well 6, in n− layer 1 between p− base layer 4 of the main unit element 21 and base layer 41 of the sense unit element 22. Also, source electrode 11 is formed in contact with region 14.

Region 14, having the same conductivity type as that of the base, is formed under the sense-signal-pickup source electrode. This region is formed in an exposed, high-resistance portion of the surface region located between the cell of the main unit element 21 and the sense unit element 22. Region 14 is in electrical contact with the main source electrode. Thus, region 14 and base region 4 are placed at the same potential by the main source electrode.

When a depletion layer expands from the junction between base region 41 and substrate 1, another depletion layer similarly expands from the junction of the region 14 and the substrate 1. The charge and discharge currents, caused when the depletion layer which extends from the junction between the base region 41 and the substrate appears and disappears, flow into the main source electrode. The charge and discharge currents which flow into the sense-signal-pickup source electrode consist of only the currents to and from the depletion layer extending from the junction between the base layer of the cell of the sense element and the high resistance layer. As a result, the transient sense signal current is reduced, thereby insuring a linear relationship between the sense signal current and the main current at the time of turn-on. The current which flows into the sense-signal-pickup source electrode in the stationary state is also reduced. Consequently, the MOS semiconductor device has less power loss.

It is evident that the present invention, which was applied to the IGBT shown in FIG. 1, may also be applied to a vertical MOSFET in which only the n+ drain layer lies under the n− layer 1.

Figure 5:
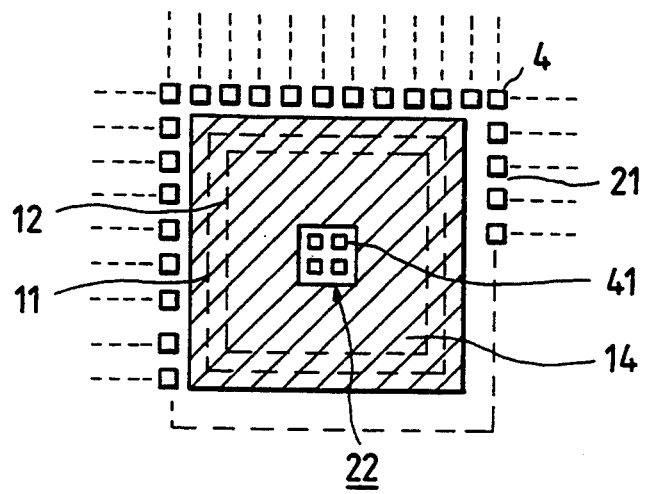
FIG. 5 is a plan view showing a part of the substrate surface of a MOS semiconductor device according to an embodiment of the present invention.
Figure 6:
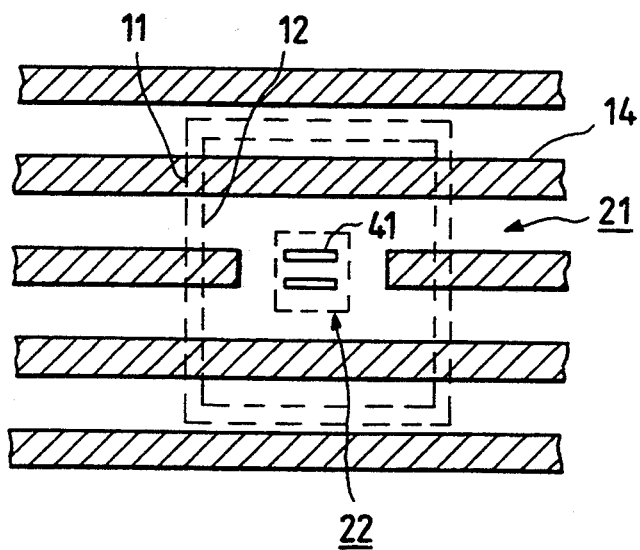
FIG. 6 is a plan view showing a part of the substrate surface of a MOS semiconductor device according to another embodiment of the present invention.

FIGS. 5 and 6 are exemplary plan views showing p+ region 14, which is cross-hatched in the Figures. As seen in FIG. 5, sense-signal-pickup source electrode 12, as indicated by a dashed line, is in contact with sense unit element 22 having four square-shaped p− base layers 41. P− base layers 4 of main unit element 21 surround the periphery of the contact portion of sense-signal-pickup source electrode 12. P− base layers 4 of main unit element 21 also contact the source electrode 11. The inner edge of the source electrode 11 contacts p+ region 14.

In the example shown in FIG. 6, p− base layers 41 of sense unit element 22, p+ region 14, and p− base layers 4 of the main unit element are stripe-shaped. P− base layers 41 extend up to the underside of the source electrode 12. P+ regions 14 are formed in electrical contact with the source electrode 11.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A MOS semiconductor device comprising:
   a semiconductor layer of a first conductivity type;
   a plurality of first regions having a second conductivity type formed in a surface region of said semiconductor layer;
   a plurality of second regions of said first conductivity type formed in a surface region of said first region;
   channel forming regions located in said first regions between said second regions and said semiconductor layer;
   a gate electrode formed on a gate insulating film which is formed on each of said channel forming regions;
   a main source electrode which contacts a first one of said plurality of first regions and a first one of said plurality of second regions;
   a sense signal pickup source electrode which contacts a second one of said plurality of first regions and a second one of said plurality of second regions;
   resistor means for providing a resistance connected between said main source electrode and said sense signal pickup source electrode; and
   a third region of said second conductivity type formed in a surface region of said semiconductor layer located between said first one of said plurality of first regions and said second one of said plurality of first regions, said third region being located apart from said first regions, and being in contact with said main source electrode.

2. A MOS semiconductor device according to claim 1, wherein a fourth region of said first conductivity type having a high impurity concentration is formed adjacent to a surface of said semiconductor layer which is opposite to the surface in which said first regions are formed.

3. A MOS semiconductor device according to claim 1, wherein a fifth region of said second conductivity type having a high impurity concentration is formed adjacent to a surface of said semiconductor layer which is opposite to the surface in which said first regions are formed.

4. A MOS semiconductor device according to claim 1, further comprising a common drain electrode connected to said semiconductor layer.

5. A MOS semiconductor device according to claim 1, wherein said gate electrode formed on said gate insulating film extends over at least a part of said third region.

6. A MOS semiconductor device according to claim 1, wherein a first depletion layer is formed at a junction of said first region and said semiconductor layer in response to the application of power to said gate electrode, and a second depletion layer is formed at a junction of said third region and said semiconductor layer in response to the application of power to said gate electrode, said first and second depletion layers being similarly expandable.

7. A MOS semiconductor device according to claim 1, wherein said first regions are base regions and said second regions are source regions.

8. A MOS semiconductor device comprising:
   a semiconductor layer having impurities of a first conductivity type;
   a main unit element formed in said semiconductor layer including a base layer, a source layer, a gate electrode, and a main source electrode contacting said base layer and said source layer of said main unit element;
   a sense unit element formed in said semiconductor layer including a base layer, a source layer, a gate electrode, and a sense signal pickup source electrode contacting said base layer and said source layer of said sense unit element;
   resistor means for providing a resistance between said main source electrode and said sense signal pickup source electrode; and
   a doped region formed in a surface of said semiconductor layer between the base layer of said main unit element and the base layer of said sense unit element, said doped region formed apart from said base layer of said main unit element and said base layer of said sense unit element and being in contact with said main source electrode.

9. A MOS semiconductor device according to claim 8, further comprising a buffer layer having impurities of said first conductivity type and having a high impurity concentration formed adjacent to a surface of said semiconductor layer which is opposite to the surface in which the base layer of said main element unit and the base layer of said sense unit element are formed.

10. A MOS semiconductor device according to claim 8, further comprising a drain layer having impurities of a second conductivity type formed adjacent to a surface of said semiconductor layer which is opposite to the surface in which the base layer of said main element unit and the base layer of said sense unit element are formed.

11. A MOS semiconductor device according to claim 8, further comprising a first channel forming region located in the base layer of said main unit element in a region between said source layer of said main unit element and the semiconductor layer, and a second channel forming region located in the base layer of said sense unit element in a region between said source layer of said sense unit element and the semiconductor layer.

12. A MOS semiconductor device according to claim 8, further comprising a common drain electrode connected to said main unit element and said sense unit element.

13. A MOS semiconductor device according to claim 8, wherein said main unit element and said sense unit element have a common gate terminal.

14. A MOS semiconductor device according to claim 8, wherein said doped region, said base layer of said main unit element, and said base layer of said sense unit element have the same conductivity type.

15. A MOS semiconductor device according to claim 8, wherein said gate electrode of said sense unit element extends over at least a part of said doped region.

16. A MOS semiconductor device according to claim 8, wherein a first depletion layer is formed at a junction of said base layer of said sense unit element and said semiconductor layer in response to the application of power to said gate electrode, and a second depletion layer is formed at a junction of said doped region and said semiconductor layer in response to the application of power to said gate electrode, said first and second depletion layers being similarly expandable.

* * * * *